United States Patent
Ikarashi (10) Patent No.: US 10,120,837 B2
(45) Date of Patent: Nov. 6, 2018

(54) MATRIX APPLICATION APPARATUS, MATRIX APPLICATION METHOD AND PROGRAM

(71) Applicant: NIPPON TELEGRAPH AND TELEPHONE CORPORATION, Chiyoda-ku (JP)

(72) Inventor: Dai Ikarashi, Musashino (JP)

(73) Assignee: NIPPON TELEGRAPH AND TELEPHONE CORPORATION, Chiyoda-ku (JP)

( * ) Notice: Subject to any disclaimer, the term of this patent is extended or adjusted under 35 U.S.C. 154(b) by 0 days.

(21) Appl. No.: 15/567,812

(22) PCT Filed: May 11, 2016

(86) PCT No.: PCT/JP2016/063955
§ 371 (c)(1),
(2) Date: Oct. 19, 2017

(87) PCT Pub. No.: WO2016/181978
PCT Pub. Date: Nov. 17, 2016

(65) Prior Publication Data
US 2018/0107629 A1   Apr. 19, 2018

(30) Foreign Application Priority Data
May 12, 2015 (JP) ................. 2015-097277

(51) Int. Cl.
*G06F 7/00* (2006.01)
*G06F 17/16* (2006.01)
*H03M 13/15* (2006.01)

(52) U.S. Cl.
CPC ............ *G06F 17/16* (2013.01); *H03M 13/15* (2013.01)

(58) Field of Classification Search
CPC .................................. G06F 17/16; H03M 13/15
(Continued)

(56) References Cited

U.S. PATENT DOCUMENTS

| 2003/0055858 | A1* | 3/2003 | Dubey | G06F 7/724 708/492 |
| 2004/0117718 | A1* | 6/2004 | Manasse | H03M 13/1515 714/781 |

OTHER PUBLICATIONS

International Search Report dated Jun. 14, 2016, in PCT/JP2016/063955 filed May 11, 2016.
(Continued)

*Primary Examiner* — Tan V. Mai
(74) *Attorney, Agent, or Firm* — Oblon, McClelland, Maier & Neustadt, L.L.P.

(57) ABSTRACT

To reduce the processing amount of a field multiplication. A matrix application apparatus computes a vector b by multiplying a vector a and a matrix A, provided that a denotes a k-th order vector having elements $a_0, \ldots, a_{k-1}$ ($a_0, \ldots, a_{k-1} \in GF(x^q)$), b denotes an m-th order vector having elements $b_0, \ldots, b_{m-1}$ ($b_0, \ldots, b_{m-1} \in GF(x^q)$), and A denotes a m-by-k Vandennonde matrix. A polynomial multiplication part computes a value $b_i$. An order reduction part designates $g_i - h_i f$ as the value $b_i$ by using a polynomial $h_i$ obtained by dividing a part of the value $b_i$ having an order equal to or higher than q by $X^q$ and a polynomial $g_i$ formed by a part of the value $b_i$ having an order lower than q.

6 Claims, 4 Drawing Sheets

(58) Field of Classification Search
USPC .................................................. 708/492, 607
See application file for complete search history.

(56) References Cited

OTHER PUBLICATIONS

Sklar, "Digital Communications: Foundations and Applications", Pearson Education, (2006), and it corresponding original English version, 37 pages.

* cited by examiner

MATRIX APPLICATION APPARATUS, MATRIX APPLICATION METHOD AND PROGRAM

TECHNICAL FIELD

The present invention relates to an encoding technique. In particular, it relates to a technique of efficiently performing an encoding process.

BACKGROUND ART

A conventional error correcting coding technique is Reed-Solomon codes. Reed-Solomon Codes are described in the non-patent literature 1, for example.

An encoding process for an error correcting code is a process of determining an output vector b by multiplying an input vector a in the form of a plaintext by a linear transformation (i.e., a matrix) A, which can be expressed by the formula (1). More specifically, the i-th row of the matrix A indicates coefficients by which the elements of the input vector a are multiplied in order to produce the i-th element $b_i$ of the output vector b.

$$b = Aa \qquad (1)$$

A decoding process for the error correcting code can also be regarded as a linear transformation. Provided that A' and b' are a matrix and a vector obtained by extracting only the rows corresponding to k elements of the matrix A and the vector b used for the decoding, respectively, the decoding process can be expressed by the formula (2).

$$b' = A'a \qquad (2)$$

Thus, if the matrix A has an inverse matrix, the vector a can be decoded according to the formula (3).

$$a = A'^{-1}b' \qquad (3)$$

In encoding for the error correcting code, it is assumed that the input vector a is a k-th order vector expressed by the formula (4), where k denotes an integer equal to or greater than 2.

$$a = \begin{pmatrix} a_0 \\ \vdots \\ a_{k-1} \end{pmatrix} \qquad (4)$$

It is assumed that the output vector b is an n-th order vector expressed by the formula (5), where n denotes an integer equal to or greater than 2, and $n \geq 2k-1$.

$$b = \begin{pmatrix} b_0 \\ \vdots \\ b_{n-1} \end{pmatrix} \qquad (5)$$

The matrix A is a matrix formed by vertically connecting a k-by-k unit matrix and an m-by-k Vandermonde matrix, where m=n−k. The Vandermonde matrix is a matrix having a special configuration in which elements of rows or columns are the terms of a geometric progression sequentially arranged.

$$A_{ij} = \begin{cases} 1 & \text{if } i = j \\ 0 & \text{if } i \neq j \text{ and } i < k \\ x^{(i-k)j} & \text{if } i \geq k \end{cases} \qquad (6)$$

where
$i \in \{0, \ldots, n-1\}$, $j \in \{0, \ldots, k-1\}$

In short, the matrix A is an n-by-k matrix expressed by the formula (7).

$$\left. \begin{pmatrix} 1 & 0 & 0 & \cdots & 0 \\ 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ \hline 1 & 1 & 1 & \cdots & 1 \\ 1 & x & x^2 & \cdots & x^{k-1} \\ 1 & x^2 & x^4 & \cdots & x^{2(k-1)} \\ \vdots & \vdots & \vdots & \ddots & \vdots \\ 1 & x^{m-1} & x^{2(m-1)} & \cdots & x^{(m-1)(k-1)} \end{pmatrix} \right\} \begin{matrix} k \text{ rows} \\ \\ \\ \\ \\ m \text{ rows} \\ \\ \\ \end{matrix} \qquad (7)$$

$$\underbrace{\qquad\qquad\qquad\qquad\qquad}_{k \text{ columns}}$$

Since the matrix A is a identity matrix up to the k-th row thereof, the first to k-th elements $b_0, \ldots, b_{k-1}$ of the output vector b agree with the elements $a_0, \ldots, a_{k-1}$ of the input vector a. The elements of the output vector b that agree with the corresponding elements of the input vector a are referred to as a "data share", and the other elements are referred to as a "parity share".

PRIOR ART LITERATURE

Non-Patent Literature

Non-patent literature 1: Bernard Sklar, "Digital Communications: Foundations and Applications," Pearson Education, 2006

SUMMARY OF THE INVENTION

Problems to be Solved by the Invention

The conventional error correcting coding technique has a problem that the processing amount is high. In particular, the processing amount of the field multiplication performed in the encoding process is high.

In view of such circumstances, an object of the present invention is to provide a matrix application technique that can reduce the processing amount of a field multiplication in an encoding technique.

Means to Solve the Problems

To solve the problems described above, a matrix application apparatus according to a first aspect of the present invention is a matrix application apparatus that computes a vector b by multiplying a vector a and a matrix A, provided that x denotes an element of an irreducible polynomial f[X] that generates an extension field $GF(x^q)$, q denotes an extension degree of the extension field $GF(x^q)$, d denotes the order of a term of the highest order of a polynomial f' obtained by removing a term of the highest order from the irreducible polynomial f[X], k denotes an integer equal to or greater than 2, m denotes an integer equal to or greater than 1, (m−1)(k−1)≤q−d, a denotes a k-th order vector having elements $a_0, \ldots, a_{k-1}$ ($a_0, \ldots, a_{k-1} \in GF(x^q)$), b denotes an m-th order vector having elements $b_0, \ldots, b_{m-1}$ ($b_0, \ldots, b_{m-1} \in GF(x^q)$), and A denotes a m-by-k Vandermonde matrix, and the matrix application apparatus comprises: a polynomial multiplication part that computes a value $b_i$ for i (i∈{0, ..., m−1}) according to the following formula:

$$b_i = \sum_{0 \leq j < k} a_j x^{ij};$$

and an order reduction part that designates $g_i - h_i f$ as the value $b_i$ for i (i∈{0, ..., m−1}) by using a polynomial $h_i$ obtained by dividing a part of the value $b_i$ having an order equal to or higher than q by $X^q$ and a polynomial $g_i$ formed by a part of the value $b_i$ having an order lower than q.

A matrix application apparatus according to a second aspect of the present invention is a matrix application apparatus that computes a vector b by multiplying a vector a and a matrix A, provided that x denotes an element of an irreducible polynomial f[X] that generates an extension field $GF(x^q)$, q denotes an extension degree of the extension field $GF(x^q)$, d denotes the order of a term of the highest order of a polynomial f' obtained by removing a term of the highest order from the irreducible polynomial f[X], k denotes an integer equal to or greater than 2, m denotes an integer equal to or greater than 1, a denotes a k-th order vector having elements $a_0, \ldots, a_{k-1}$ ($a_0, \ldots, a_{k-1} \in GF(x^q)$), b denotes an m-th order vector having elements $b_0, \ldots, b_{m-1}$ ($b_0, \ldots, b_{m-1} \in GF(x^q)$), A denotes a m-by-k Vandermonde matrix, and a denotes a positive integer equal to or smaller than q−d, and the matrix application apparatus comprises: a vector copy part that designates $a_j$ and 0 as $a'_j$ and $d_j$, respectively, ($a'_j = a_j$, =0) for j (j∈{0, ..., k−1}); a polynomial multiplication part that computes the value $b_i$ for i (i∈{0, ..., m−1}) according to the following formula:

$$b_i = \sum_{0 \leq j < k} a'_j x^{ij - d_j}$$

an order reduction part that designates $g_i - h_i f$ as the value $b_i$ for i (i∈{0, ..., m−1}) by using a polynomial $h_i$ obtained by dividing a part of the value $b_i$ having an order equal to or higher than q by $X^q$ and a polynomial $g_i$ formed by a part of the value $b_i$ having an order lower than q; and a vector update part that updates $a'_j$: and $d_j$: according to $a'_j := a'_j x^\alpha$ and $d_j := d_j + \alpha$, respectively, for i (i∈{0, ..., m−1}) and j (j∈{0, ..., k−1}) if i≠m−1 and (i+1)j−d≥q−d.

Effects of the Invention

According to the present invention, the processing amount of a field multiplication involved in an encoding technique can be reduced.

DETAILED DESCRIPTION OF THE EMBODIMENTS

Before describing an embodiment, a principle of the present invention will be described.

The following description will be made on the assumption that x represents an element X of an extension field $GF(2^{64})$ expressed by an irreducible polynomial $f[X] = X^{64} + X^4 + X^3 + X^2 + X + 1$. x is 2 in an integer expression.

$GF(2^{64})$ is a set of remainders of a division of a polynomial by a 64-th order polynomial f[X] whose coefficients are integers modulo 2 (division as polynomials). $GF(2^{64})$ is a field on which the four arithmetic operations are possible. $GF(2^{64})$ may also be regarded as a 64-th order vector of bits with a special arithmetic. $GF(2^{64})$ can be expressed by a 64-bit integer, a term $x^i$ of which is expressed as $2^i$. For example, $1+x+x^3$ is expressed as $2^0 + 2^1 + 2^3 = 11$.

Multiplication of a and b (a, b∈$GF(2^{64})$) is an operation of multiplying two 63-th order polynomials a and b (see the formula (8)) by each other and then dividing the product by the 64-th order polynomial f (see the formula (9)). A coefficient of a λ-th order term is expressed by the formula (10).

$$a = \sum_{i<64} a_i x^i, \quad b = \sum_{i<64} b_i x^i \tag{8}$$

$$\sum_{i<64} \sum_{j<64} a_i b_j x^{i+j} \bmod f \tag{9}$$

$$\bigoplus_{i+j=\lambda} a_i b_j \tag{10}$$

In the formula (9), a process of taking a modulus f of the 126-th order polynomial to provide a 63-th order polynomial is referred to as reduction. The reduction is achieved by using the equivalence relation expressed by the formula (11).

$$F = x^{64} + x^4 + x^3 + x + 1 = 0 \bmod f \tag{11}$$

The formula (11) can be transformed into the formula (12), which represents a relation that reduces the 64-th order teen to a fourth-order formula.

$$x^{64} = x^4 + x^3 + x + 1 \bmod f \tag{12}$$

As shown by the formula (13), the order of any 64-th or higher order term can be reduced by 60.

$$x^{64+n} = x^n(x^4 + x^3 + X + 1) \bmod f \tag{13}$$

The 126-th order polynomial can be expressed by a 63-th order polynomial g and a 62-th order polynomial h according to the formula (14).

$$g + x^{64}h = g + (x^4 + x^3 + x + 1)h \bmod f \tag{14}$$

A multiplication (x+1)a of an arbitrary element a and x+1 can be expressed by the formula (15).

$$xa + a = xa \oplus a. \tag{15}$$

In addition, since the order of each term of $x^na$ is n higher than the order of the corresponding term of a, each term of $x^na$ is equivalent to $2^n$ times the term in the integer expression or the term left-shifted by n bits. Thus, $x^na$ can be expressed by the formula (16).

$$(x^4+x^3+x+1)h=(h\ll 4)\oplus(h\ll 3)\oplus(h\ll 1)\oplus h \tag{16}$$

Since h is a 62-th order polynomial, the term $$(h\ll 4)\oplus(h\ll 3)$$

in the formula (16) is a 64-th or higher order polynomial, and the order needs to be further reduced. The part of 64-th or higher order is expressed by the formula (17).

$$x^4(h_{62}x^{62}+h_{61}x^{61}+h_{60}x^{60})+x^3(h_{62}x^{62}+h_{61}x^{61})=x^{64}((h\gg 60)\oplus(h\gg 61)) \tag{17}$$

Considering that in the case of the 64-bit integer, any number is truncated to 64 bits, computation can be performed according to the formula (18).

$$X^{64}(h\oplus(h\gg 60)\oplus(h\gg 61))=(x^4+x^3+x+1)(h\oplus(h\gg 60)\oplus(h\gg 61))=(x^3+1)(x+1)h\oplus(h\gg 60)\oplus(h\gg 6)) \tag{18}$$

In multiplication, if one of the multiplier is a number with 61 bits or a smaller number of bits (more strictly, if the total number of bits of the multipliers is equal to or less than 125), the formula (19) holds, so that the reduction can be made more efficient.

$$(h\gg 60)\oplus(h\gg 61)=0 \tag{19}$$

Thus, considering the processing amount including the reduction, the multiplication by a 61-bit number with only one bit being 1, that is, $2^i$ where $0\le i\le 60$ is quick.

For the conventional error correcting code, a parity share is generated by using the Vandermonde matrix. The parity share is computed from k inputs $a_0, \ldots, a_{k-1}$ ($a_0, \ldots, a_{k-1}\in GF(x^q)$) according to the formula (20). $GF(x^q)$ is an extension field that is generated from an irreducible polynomial f[X] and has an extension degree of q. x denotes an element of the irreducible polynomial f in and f[X]=X.

$$\sum_{0\le j<k} a_j x^{ij} \tag{20}$$

When the field is an extension field, the computation can be made more efficient. It is assumed that a part of the irreducible polynomial f that excludes the term of the highest order is denoted as f'. It is also assumed that the order of the term of the highest order of the polynomial f' is denoted by d. Then, if a relation $(m-1)(k-1)\le q-d$ holds, the multiplication is simpler than normal as described below.

If i is smaller than q, $x^i=X^i$. Assuming that the input a is expressed by the formula (21), the result of the polynomial multiplication is as shown by the formula (22).

$$\sum_{j<q} a_j X^j \tag{21}$$

$$aX^i = \left(\sum_{j<q} a_j X^j\right) X^i \tag{22}$$

Since the order is equal to or higher than q, a remainder with respect to f is determined based on $f\equiv 0 \Leftrightarrow X^q\equiv -f'$. That is, provided that a part of $aX^i$ comprising the terms of orders lower than q is denoted by g, and a polynomial obtained by dividing a part of $aX^i$ comprising the terms of q-th or higher orders by $X^q$ is denoted by h, a relation $aX^i\equiv g-hf'$ holds. In extension field multiplication, such order reduction is repeated until the order of g-hf' is q-1. If i is equal to or smaller than q-d, the order of $aX^i$ is only $q-1+q-d\equiv 2q-d-1$, and the order of h is only q-d-1. Since f' is a d-th order polynomial, the order of hf' is only q-1, and one order reduction suffices.

In the following, embodiments of the present invention will be described in detail. In the drawings, components having the same function are denoted by the same reference numerals, and redundant descriptions thereof will be omitted.

[First Embodiment]

Figure 1:
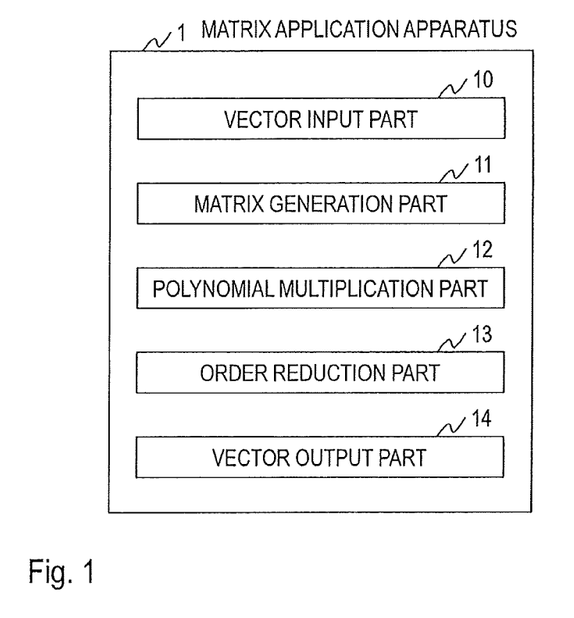
FIG. 1 is a diagram illustrating a functional configuration of a matrix application apparatus according to a first embodiment.

As illustrated in FIG. 1, a matrix application apparatus 1 according to a first embodiment comprises a vector input part 10, a matrix generation part 11, a polynomial multiplication part 12, an order reduction part 13, and a vector output part 14. A matrix application method according to the first embodiment is achieved by the matrix application apparatus 1 performing processings in steps illustrated in FIG. 2.

The matrix application apparatus 1 is a special apparatus formed by a well-known or dedicated computer in which a special program is loaded, the computer having a central processing unit (CPU: Central Processing Unit), a main memory (RAM: Random Access Memory), and other components. The matrix application apparatus 1 performs the processings under the control of the central processing unit. Data input to the matrix application apparatus 1 and data resulting from the processings are stored in the main memory, and the data stored in the main memory is loaded to the central processing unit and used for other processings. At least part of the processing parts of the matrix application apparatus 1 may be formed by hardware, such as an integrated circuit.

Figure 2:
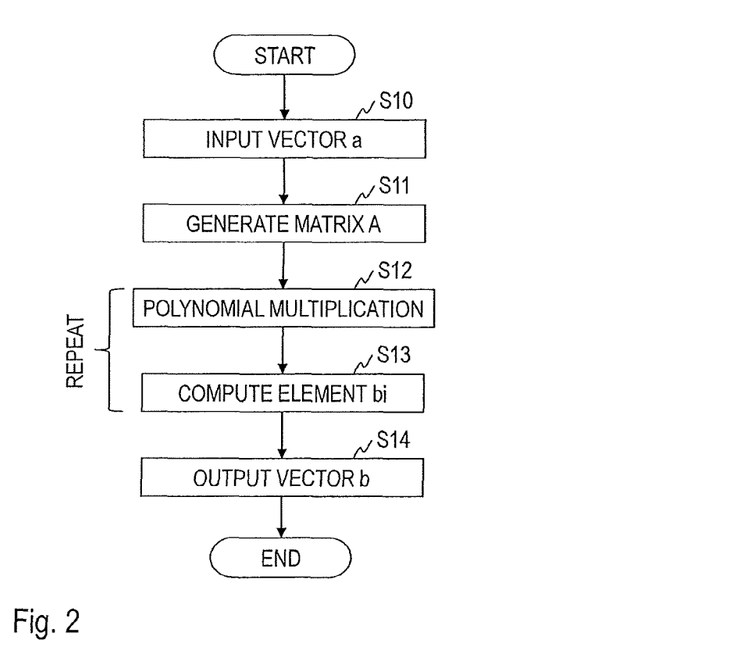
FIG. 2 is a diagram illustrating a process flow of a matrix application method according to the first embodiment.

With reference to FIG. 2, a procedure of the matrix application method according to the first embodiment will be described.

In step S10, a k-th order vector $a=(a_0, \ldots, a_{k-1})$ having elements $a_0, \ldots, a_{k-1}$ ($a_0, \ldots, a_{k-1}\in GF(x^q)$) is input to the vector input part 10. The vector a is fed to the polynomial multiplication part 12. The vector a is defined by the formula (23)

$$a = \begin{pmatrix} a_0 \\ \vdots \\ a_{k-1} \end{pmatrix} \tag{23}$$

In step S11, the matrix generation part 11 generates an m-by-k Vandermonde matrix A. m and k are values for which a relation $(m-1)(k-1)\le q-d$ holds. The matrix A is fed to the polynomial multiplication part 12. The matrix A is defined by the formula (24).

$$A_{ij}=x^{(i-k)j} \tag{24}$$

where $i\in\{0, \ldots, m-1\}, j\in\{0, \ldots, k-1\}$

That is, the matrix A is an m-by-k matrix expressed by the formula (25).

$$\begin{pmatrix} 1 & 1 & 1 & \ldots & 1 \\ 1 & x & x^2 & \ldots & x^{k-1} \\ 1 & x^2 & x^4 & \ldots & x^{2(k-1)} \\ \vdots & \vdots & \vdots & \ddots & \vdots \\ 1 & x^{m-1} & x^{2(m-1)} & \ldots & x^{(m-1)(k-1)} \end{pmatrix} \Bigg\} m \text{ rows} \quad (25)$$

$$\underbrace{\phantom{xxxxxxxxxxxxxxxxxxxxxxxxxx}}_{k \text{ columns}}$$

In step S12, the polynomial multiplication part 12 computes a value $b_i$ for i ($i \in \{0, \ldots, m-1\}$) according to the formula (26). Values $b_0, \ldots, b_{m-1}$ are fed to the order reduction part 13.

$$b_i = \sum_{0 \le j < k} a_j x^{ij} \quad (26)$$

In step S13, the order reduction part 13 generates, for i ($i \in \{0, \ldots, m-1\}$), a polynomial $h_i$ obtained by dividing a part of the value $b_i$ having q-th or higher orders by $X^q$ and a polynomial $g_i$ that is a part of the value $b_i$ having orders lower than q. $g_i - h_i f'$ is computed from the polynomials $h_i$ and $g_i$, to update the value $b_i$. Updated values $b_0, \ldots, b_{m-1}$ are fed to the vector output part 14.

The processings in steps S12 and S13 are performed for each i ($i \in \{0, \ldots, m-1\}$). In this way, the values $b_0, \ldots, b_{m-1}$ are computed. The processings for different values of i can be performed in parallel.

In step S14, the vector output part 14 outputs an m-th vector b (b=($b_0, \ldots, b_{m-1}$)) having values $b_0, \ldots, b_{m-1}$ as elements.

In the matrix application method according to the first embodiment, a relation $(m-1)(k-1) \le q - d$ holds, so that one reduction suffices in all field multiplications. Thus, the processing amount of the multiplication including reductions is reduced.

[Second Embodiment]

A second embodiment is an extension in which the processing amount of the field multiplication is reduced even if the relation $(m-1)(k-1) \le q - d$ does not hold.

Figure 3:
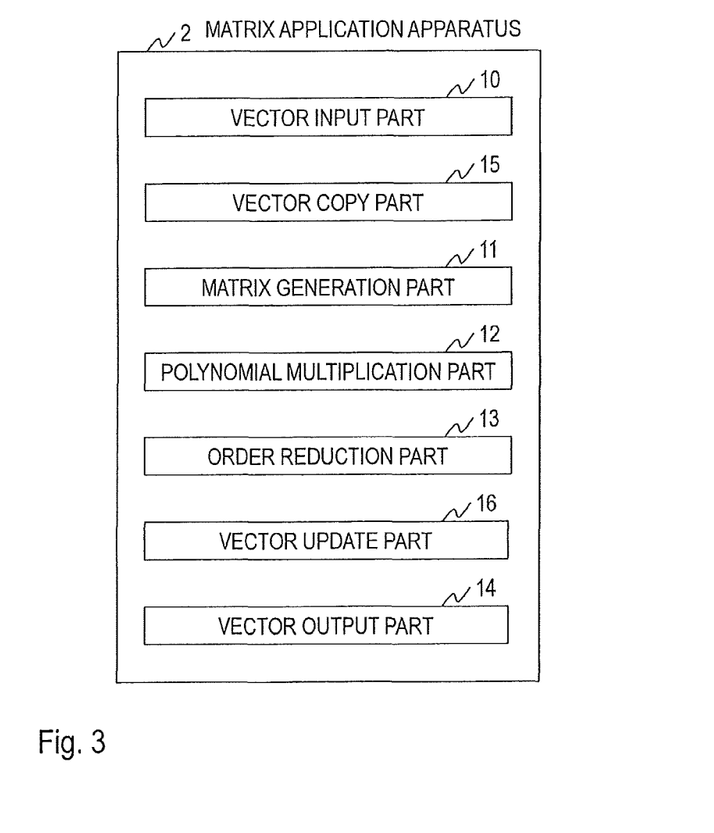
FIG. 3 is a diagram illustrating a functional configuration of a matrix application apparatus according to a second embodiment.

As illustrated in FIG. 3, as with the matrix application apparatus 1 according to the first embodiment, a matrix application apparatus 2 according to the second embodiment comprises the vector input part 10, the matrix generation part 11, the polynomial multiplication part 12, the order reduction part 13, and the vector output part 14. The matrix application apparatus 2 further comprises a vector copy part 15 and a vector update part 16. A matrix application method according to the second embodiment is achieved by the matrix application apparatus 2 performing processings in steps illustrated in FIG. 4.

Figure 4:
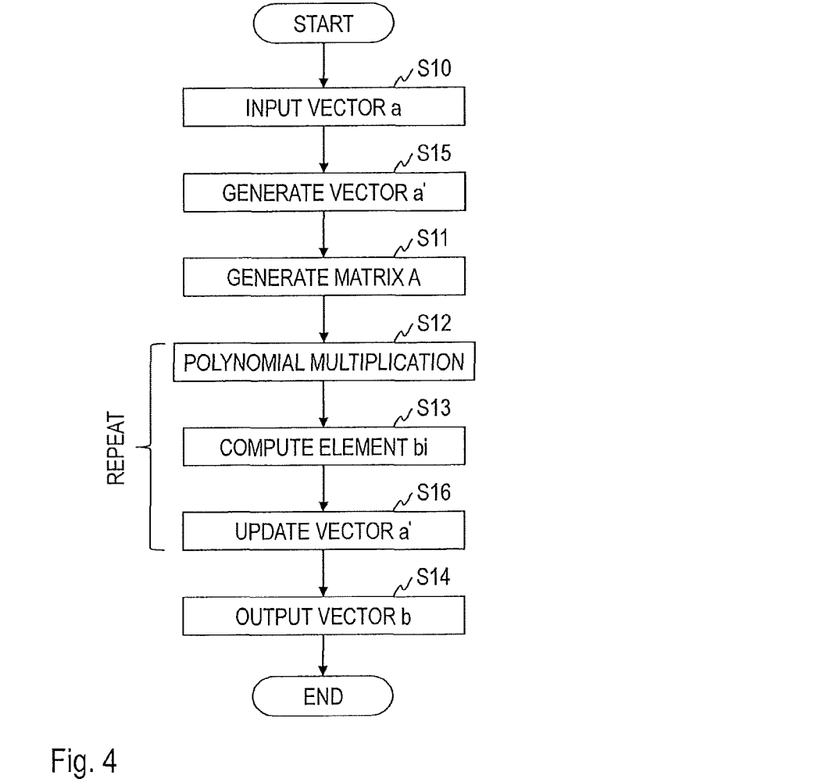
FIG. 4 is a diagram illustrating a process flow of a matrix application method according to the second embodiment.

With reference to FIG. 4, a procedure of the matrix application method according to the second embodiment will be described. The following description will be focused mainly on differences from the first embodiment described above.

In step S15, the vector copy part 15 designates $a_j$ as $a'_j$ ($a'_j = a_j$) for j ($j \in \{0, \ldots, k-1\}$). In addition, the vector copy part 15 designates 0 as $d_j$ ($d_j = 0$). A vector a' (a'=($a'_0, \ldots, a'_{k-1}$)) and values $d_0, \ldots, d_{k-1}$ are fed to the polynomial multiplication part 12.

In step S11, the matrix generation part 11 generates an m-by-k Vandelinonde matrix A. Unlike the first embodiment, the relation $(m-1)(k-1) \le q - d$ may not hold. The matrix A is fed to the polynomial multiplication part 12.

In step S12, the polynomial multiplication part 12 computes the value $b_i$ for i ($i \in \{0, \ldots, m-1\}$) according to the formula (27). Values $b_0, \ldots, b_{m-1}$ are fed to the order reduction part 13.

$$b_i = \sum_{0 \le j < k} a'_j x^{ij - d_j} \quad (27)$$

In step S16, for j ($j \in \{0, \ldots, k-1\}$), if $i \ne m-1$ and $(i+1)j - d \ge q - d$, the vector update part 16 updates $a'_j$ and $d_j$: according to $a'_j := a'_j x^\alpha$, and $d_j := d_j + \alpha$, respectively. $\alpha$ denotes a positive integer equal to or smaller than q-d. The updated vector a' (a'=($a'_0, a'_{k-1}$)) and the updated values $d_0, \ldots, d_{k-1}$ are fed to the polynomial multiplication part 12.

Although the second embodiment is inferior to the first embodiment in reduction of the processing amount, the second embodiment is sufficiently effective in quickening the processing if the number of times of update by the vector update part 16 is low (that is, if a is appropriately set).

[Third Embodiment]

In the embodiments described above, if the order of the extension field is a power of 2, the addition is simply an exclusive-OR (XOR) operation. In addition, since X is 2 in an integer expression, the polynomial multiplication ($a_i x^{ij}$) is simply an ij bit shift. Thus, the processing is more efficiently performed by a computer.

The present invention is advantageous due to the fact that, with the Vandemionde matrix, x of the right ax of the multiplication is fixed in a simple range. If the order of any of $a_i X^j$ in the polynomial multiplication exceeds $2q - d - 1$, one order reduction does not suffice. And the polynomial multiplication of $x^{ij}$ is simply a bit shift operation because all the elements of the Vandermonde matrix are powers of x.

The present invention is not limited to the embodiments described above, and modifications can be made as required without departing from the spirit of the present invention. The various processings described above with regard to the embodiments are not necessarily sequentially performed in the order described above but also can be performed in parallel with or independently of each other depending on the processing capacity of the apparatus that perfoins the processings or as required.

[Program and Storage Medium]

When a computer carries out the various processing functions of the apparatus according to the embodiments described above, the specific processings of the functions that the apparatus needs to have are described in a program. The various processing functions of the apparatus described above are implemented on the computer by the computer executing the program.

The program that describes the specific processings can be recorded in a computer readable recording medium. Any computer readable recording medium can be used, such as a magnetic recording device, an optical disk, a magneto-optical recording medium, or a semiconductor memory.

The program can be distributed by selling, transferring or lending a portable recording medium, such as a DVD, or a CD-ROM, on which the program is recorded, for example. Furthermore, the program may be distributed by storing the program in a memory of a server computer and transferring the program from the server computer to another computer.

The computer that executes the program first temporarily stores, in a memory thereof, the program recorded on a portable recording medium or transferred from a server computer, for example. When performing the processings, the computer reads the program from the memory of the computer and performs the processings according to the read program. In an alternative implementation, the computer may read the program directly from the portable recording medium and perform the processings according to the program, or the computer may perform the processings according to the program each time the computer receives the program transferred from the server computer. As a further alternative, the processings described above may be performed on an application service provider (ASP) basis, in which the server computer does not transfer the program to the computer, and the processings are implemented only through execution instruction and result acquisition. The program according to the embodiments of the present invention includes a quasi-program, which is information to be processed by a computer (such as data that is not a direct instruction to a computer but has a property that defines the processings performed by the computer).

Although the apparatus according to the embodiments of the present invention have been described as being implemented by a computer executing a predetermined program, at least part of the specific processings may be implemented by hardware.

What is claimed is:

1. A matrix application apparatus that computes a vector b by multiplying a vector a and a matrix A, wherein
x denotes an element of an irreducible polynomial f[X] that generates an extension field $GF(x^q)$, q denotes an extension degree of the extension field $GF(x^q)$, d denotes the order of a term of the highest order of a polynomial f' obtained by removing a term of the highest order from the irreducible polynomial f[X], k denotes an integer equal to or greater than 2, m denotes an integer equal to or greater than 1, $(m-1)(k-1) \leq q-d$, a denotes a k-th order vector having elements $a_0, \ldots, a_{k-1}$ ($a_0, \ldots, a_{k-1} \in GF(x^q)$), b denotes an m-th order vector having elements $b_0, \ldots, b_{m-1}$ ($b_0, \ldots, b_{m-1} \in GF(x^q)$), A denotes a m-by-k Vandermonde matrix, and
the matrix application apparatus comprising:
circuitry configured to:
compute a value $b_i$ for i ($i \in \{0, \ldots, m-1\}$) according to the following formula:

$$b_i = \sum_{0 \leq j < k} a_j x^{ij};$$

and
designate $g_i - h_i f'$ as the value $b_i$ for i ($i \in \{0, \ldots, m-1\}$) by using a polynomial $h_i$ obtained by dividing a part of the value $b_i$ having an order equal to or higher than q by $X^q$ and a polynomial $g_i$ formed by a part of the value $b_i$ having an order lower than q.

2. A matrix application apparatus that computes a vector b by multiplying a vector a and a matrix A, wherein
x denotes an element of an irreducible polynomial f[X] that generates an extension field $GF(x^q)$, q denotes an extension degree of the extension field $GF(x^q)$, d denotes the order of a term of the highest order of a polynomial f' obtained by removing a term of the highest order from the irreducible polynomial f[X], k denotes an integer equal to or greater than 2, m denotes an integer equal to or greater than 1, a denotes a k-th order vector having elements $a_0, \ldots, a_{k-1}$ ($a_0, \ldots, a_{k-1} \in GF(x^q)$), b denotes an m-th order vector having elements $b_0, \ldots, b_{m-1}$ ($b_0, \ldots, b_{m-1} \in GF(x^q)$), A denotes a m-by-k Vandermonde matrix, $\alpha$ denotes a positive integer equal to or smaller than q-d, and
the matrix application apparatus comprising:
circuitry configured to:
designate $a_j$ and 0 as $a'_j$ and $d_j$, respectively, ($a'_j := a_j$, $d_j := 0$) for j ($j \in \{0, \ldots, k-1\}$);
compute the value $b_i$ for i ($i \in \{0, \ldots, m-1\}$) according to the following formula:

$$b_i = \sum_{0 \leq j < k} a'_j x^{ij - d_j};$$

designate $g_i - h_i f'$ as the value $b_i$ for i ($i \in \{0, \ldots, m-1\}$) by using a polynomial $h_i$ obtained by dividing a part of the value $b_i$ having an order equal to or higher than q by $X^q$ and a polynomial $g_i$ formed by a part of the value $b_i$ having an order lower than q; and
update $a'_j$ and $d_j$ according to $a'_j := a'_j x^{\alpha}$ and $d_j := d_j + \alpha$, respectively, for i ($i \in \{0, \ldots, m-1\}$) and j ($j \in \{0, \ldots, k-1\}$) if $i \neq m-1$ and $(i+1)j - d \geq q - d$.

3. A matrix application method of computing a vector b by multiplying a vector a and a matrix A, wherein
x denotes an element of an irreducible polynomial f[X] that generates an extension field $GF(x^q)$, q denotes an extension degree of the extension field $GF(x^q)$, d denotes the order of a term of the highest order of a polynomial f' obtained by removing a term of the highest order from the irreducible polynomial f[X], k denotes an integer equal to or greater than 2, m denotes an integer equal to or greater than 1, $(m-1)(k-1) \geq q-d$, a denotes a k-th order vector having elements $a_0, \ldots, a_{k-1}$ ($a_0, \ldots, a_{k-1} \in GF(x^q)$), b denotes an m-th order vector having elements $b_0, \ldots, b_{m-1}$ ($b_0, \ldots, b_{m-1} \in GF(x^q)$), A denotes a m-by-k Vandermonde matrix, and
the matrix application method comprising:
computing, by circuitry of a matrix application apparatus, a value $b_i$ for i ($i \in \{0, \ldots, m-1\}$) according to the following formula:

$$b_i = \sum_{0 \leq j < k} a_j x^{ij};$$

and
designating, by circuitry of the matrix application apparatus, $g_i - h_i f'$ as the value $b_i$ for i ($i \in \{0, \ldots, m-1\}$) by using a polynomial $h_i$ obtained by dividing a part of the value $b_i$ having an order equal to or higher than q by $X^q$ and a polynomial $g_i$ formed by a part of the value $b_i$ having an order lower than q.

4. A matrix application method of computing a vector b by multiplying a vector a and a matrix A, wherein
x denotes an element of an irreducible polynomial f[X] that generates an extension field $GF(x^q)$, q denotes an extension degree of the extension field $GF(x^q)$, d denotes the order of a term of the highest order of a polynomial f obtained by removing a term of the highest order from the irreducible polynomial f[X], k denotes an integer equal to or greater than 2, m denotes an integer equal to or greater than 1, a denotes a k-th order vector having elements $a_0, \ldots, a_{k-1}$ ($a_0, \ldots, a_{k-1} \in GF(x^q)$), b denotes an m-th order vector having elements $b_0, \ldots, b_{m-1}$ ($b_0, \ldots, b_{m-1} \in GF(x^q)$), A denotes a m-by-k Vandennonde matrix, $\alpha$ denotes a positive integer equal to or smaller than q−d, and the matrix application method comprising:

designating, by circuitry of a matrix application apparatus $a_j$ and 0 as $a'_j$ and $d_j$, respectively, ($a'_j = a_j$, $d_j = 0$) for j ($j \in \{0, \ldots, k-1\}$);

computing, by circuitry of the matrix application apparatus, the value $b_i$ for i ($i \in \{0, \ldots, m-1\}$) according to the following formula:

$$b_i = \sum_{0 \leq j < k} a'_j x^{ij - d_j};$$

designating, by circuitry of the matrix application apparatus, $g_i$-$h_i$f' as the value $b_i$ for i ($i \in \{0, \ldots, m-1\}$) by using a polynomial $h_i$ obtained by dividing a part of the value $b_i$ having an order equal to or higher than q by $X^q$ and a polynomial $g_i$ formed by a part of the value $b_i$ having an order lower than q; and updating, by circuitry of the matrix application apparatus, $a'_j$ and $d_j$ according to $a'_j := a'_j x^\alpha$ and $d_j := d_j + \alpha$, respectively, for i ($i \in \{0, \ldots, m-1\}$) and j($j \in \{0, \ldots, k-1\}$) if i≠m−1 and (i+1)j−d≥q−d.

5. A non-transitory computer readable medium including computer executable instructions that make a matrix application apparatus, wherein x denotes an element of an irreducible polynomial f[X] that generates an extension field $GF(x^q)$, q denotes an extension degree of the extension field $GF(x^q)$, d denotes the order of a term of the highest order of a polynomial f' obtained by removing a term of the highest order from the irreducible polynomial f[X], k denotes an integer equal to or greater than 2, m denotes an integer equal to or greater than 1, (m−1)(k−1)≥q−d, a denotes a k-th order vector having elements $a_0, \ldots, a_{k-1}$ ($a_0, \ldots, a_{k-1} \in GF(x^q)$), b denotes an m-th order vector having elements $b_0, \ldots, b_{m-1}$ ($b_0, \ldots, b_{m-1} \in GF(x^q)$), A denotes a m-by-k Vandermonde matrix, perform a method comprising:
computing, by circuitry of a matrix application apparatus, a value $b_i$ for i ($i \in \{0, \ldots, m-1\}$) according to the following formula:

$$b_i = \sum_{0 \leq j < k} a_j x^{ij};$$

and designating, by circuitry of the matrix application apparatus, $g_i$-$h_i$f' as the value $b_i$ for i ($i \in \{0, \ldots, m-1\}$) by using a polynomial $h_i$ obtained by dividing a part of the value $b_i$ having an order equal to or higher than q by $X^q$ and a polynomial $g_i$ formed by a part of the value $b_i$ having an order lower than q.

6. A non-transitory computer readable medium including computer executable instructions that make a matrix application apparatus, wherein x denotes an element of an irreducible polynomial f[X] that generates an extension field $GF(x^q)$, q denotes an extension degree of the extension field $GF(x^q)$, d denotes the order of a term of the highest order of a polynomial f' obtained by removing a term of the highest order from the irreducible polynomial f[X], k denotes an integer equal to or greater than 2, in denotes an integer equal to or greater than 1, a denotes a k-th order vector having elements $a_0, \ldots, a_{k-1}$ ($a_0, \ldots, a_{k-1} \in GF(x^q)$), b denotes an m-th order vector having elements $b_0, \ldots, b_{m-1}$ ($b_0, \ldots, b_{m-1} \in GF(x^q)$), A denotes a m-by-k Vandermonde matrix, $\alpha$ denotes a positive integer equal to or smaller than q−d, and perform a method comprising:
designating $a_j$ and 0 as $a'_j$ and $d_j$, respectively, ($a'_j = a_j$, $d_j = 0$) for j ($j \in \{0, \ldots, k-1\}$));

computing the value $b_i$ for i ($i \in \{0, \ldots, m-1\}$) according to the following formula:

$$b_i = \sum_{0 \leq j < k} a'_j x^{ij - d_j};$$

designating $g_i$-$h_i$f' as the value $b_i$ for i ($i \in \{0, \ldots, m-1\}$) by using a polynomial $h_i$ obtained by dividing a part of the value $b_i$ having an order equal to or higher than q by $X^q$ and a polynomial $g_i$ formed by a part of the value $b_i$ having an order lower than q; and updating and $a'_j$ and $d_j$ according to $a'_j := a'_j x^\alpha$ and $d_j := d_j + \alpha$, respectively, for i ($i \in \{0, \ldots, m-1\}$) and j ($j \in \{0, \ldots, k-1\}$) if i≠m−1 and (i+1)j−d≥q−d.

\* \* \* \* \*